United States Patent [19]
Kurihara et al.

[11] Patent Number: 5,388,053
[45] Date of Patent: Feb. 7, 1995

[54] DATA PROCESSING METHOD FOR OBTAINING DATA INDICATING PULSE PERIOD

[75] Inventors: Kazumasa Kurihara; Tsutomu Takahashi, both of Higashimatsuyama, Japan

[73] Assignee: Zexel Corporation, Tokyo, Japan

[21] Appl. No.: 264,248

[22] Filed: Jun. 22, 1994

Related U.S. Application Data

[63] Continuation of Ser. No. 888,640, May 27, 1992, abandoned.

[30] Foreign Application Priority Data

May 28, 1991 [JP] Japan ................................. 3-150933

[51] Int. Cl.6 ............................................. G01R 29/02
[52] U.S. Cl. ...................................... 364/486; 364/567
[58] Field of Search ............................... 364/565, 486

[56] References Cited

U.S. PATENT DOCUMENTS

| | | | |
|---|---|---|---|
| 4,184,203 | 1/1980 | Skarvada | 364/565 |
| 4,199,719 | 4/1980 | Grob | 364/565 |
| 4,517,831 | 5/1985 | Hirano. | |
| 4,763,261 | 8/1988 | Imanaka et al. | 364/565 |
| 4,884,227 | 11/1989 | Watanabe | 364/565 |
| 4,891,588 | 1/1990 | Fujioka et al. | 364/565 |

*Primary Examiner*—Emanuel T. Voeltz
*Assistant Examiner*—Thomas Peeso
*Attorney, Agent, or Firm*—Pollock, Vande Sande & Priddy

[57] ABSTRACT

A data processing method for obtaining data indicating the period between pulses comprises measuring the interval between the subject pulses, separately generating time pulses of a prescribed period, measuring the time between the most recent subject pulse and the most recent time pulse, outputting the interval between the subject pulses as the pulse period data if it is longer than the time between the most recent subject pulse and the most recent time pulse and otherwise outputting the latter time as the pulse period data. The data obtained in this way more precisely indicates the actual pulse period in cases where noise pulses occur between subject pulses.

10 Claims, 8 Drawing Sheets

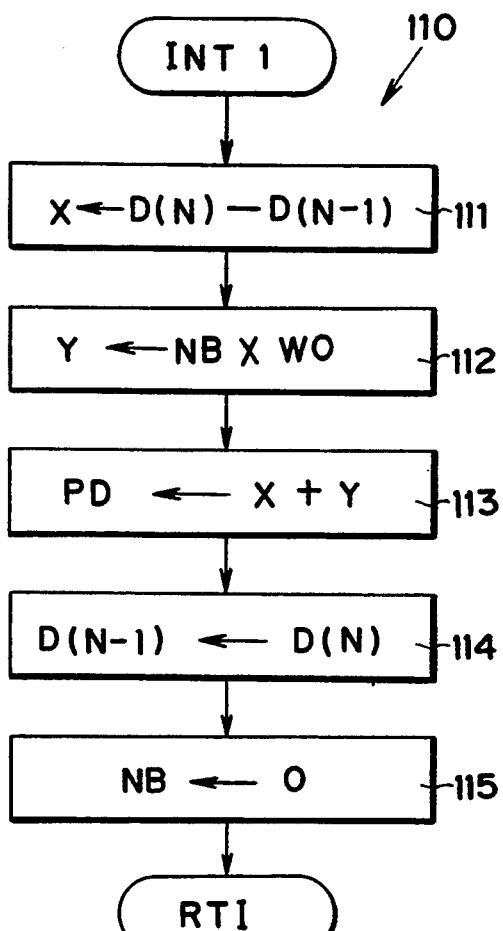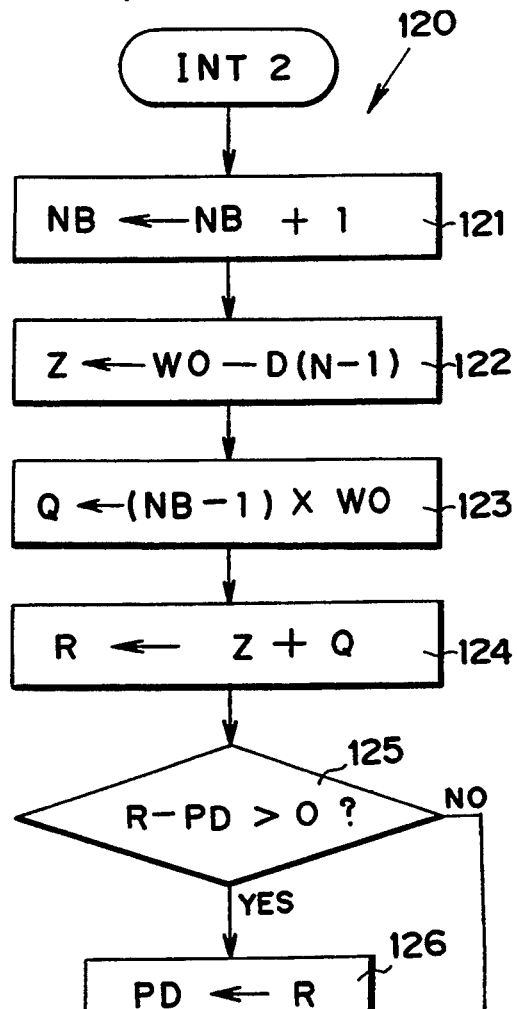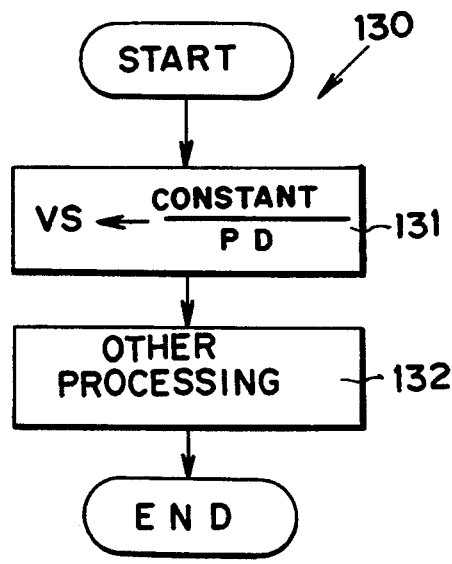

DATA PROCESSING METHOD FOR OBTAINING DATA INDICATING PULSE PERIOD

This application is a continuation, of Ser. No. 07/888,640 filed on May 27, 1992, now abandoned.

BACKGROUND OF THE INVENTION

Field of the Invention

This invention relates to a data processing method for obtaining data indicating the periods between pulse occurrences, for example, a data processing method especially well adapted for obtaining data indicating the rotational speed of a rotating body based on pulses output in response to prescribed angles of rotation of the rotating body, as in a vehicle speed detector.

Description of the Prior Art

As a method for calculating the rotational speed of a rotating body there is widely used one in which a pulse is generated once per prescribed angle of rotation of the rotating body and the rotational speed is calculated from the pulse period.

One method used for calculating the pulse period in such applications involves counting the number of pulses generated per a fixed period of time. Another involves measuring the time lapse between the occurrence of a given pulse and the occurrence of the succeeding pulse in terms of clock pulses of a higher frequency (shorter period) than the pulses whose period is being measured (U.S. Pat. No. 4,517,831).

The latter method is more often adopted because it can be accomplished merely by measuring the time lapse between consecutive pulses and therefore provides better response than the former method which requires a prescribed calculation to be carried out following the occurrence of a large number of pulses.

In the latter method, however, when the rotational speed being measured becomes low and, accordingly, the pulse period becomes long, the period between updates of the speed data obtained by the calculation becomes long. Therefore, in a case where the rotational speed is actually low but, the calculated speed indicated by the output data is high owing to the occurrence of a noise pulse, the erroneous high speed data will be retained for a relatively long time. Any of the various control operations conducted on the basis of the rotational speed data will not proceed smoothly during the time that erroneous data is retained.

SUMMARY OF THE INVENTION

One object of the invention is therefore to provide an improved data processing method for obtaining pulse period data which overcomes the aforesaid drawback of the prior art.

Another object of the invention is to provide a data processing method for obtaining pulse period data by measuring the time lapse between consecutive pulses, wherein the effect of any noise pulse superposed on the train of measured pulses can be reduced.

For achieving these purposes, the present invention provides a data processing method for obtaining period data indicating the period of measured pulses comprising a first measurement step for obtaining measured period data by measuring time intervals between occurrences of the measured pulses, a step for outputting time pulses of a prescribed fixed period, a second measurement step responsive to the individual time pulses for obtaining lapsed time data indicating the time lapse between the occurrence of the most recent measured pulse and the occurrence of the most recent time pulse, and a processing step responsive to the most recent lapsed time data and the most recent measured pulse period data for outputting the most recent measured pulse period data as the pulse period data at that time if the time period indicated by the most recent lapsed time data is shorter than that indicated by the most recent pulse period data and, up to the occurrence of the next measurement pulse, outputting the most recent lapsed time data instead of the most recent measured pulse period data as the pulse period data at that time if the time indicated by the most recent lapsed time data is longer than that indicated by the most recent measured pulse period data.

In this arrangement, the time pulses are regularly output at prescribed time intervals and the time lapse between the occurrence of the most recent measured pulse and the occurrence of the most recent time pulse is measured. Therefore, after the occurrence of a given measured pulse and up to the time of the occurrence of the succeeding one, the time lapse grows longer by a fixed amount with the occurrence of each succeeding time pulse. The lapsed time determined in this manner is compared with the most recent measured pulse period. If the lapsed time is longer than the most recent measured pulse period, the lapsed time is used in place of the most recent measured pulse period as the pulse period data at that time.

Therefore, if input of the next measured pulse is received before the lapsed time has become longer than the time indicated by the most recent measured pulse period data, the value output as the result of the measurement is not corrected. On the other hand, when the next measured pulse is not received before the lapsed time has become longer than the time indicated by the most recent measured pulse period data, the value output as the result of the measurement is corrected without waiting for the input of the next measured pulse.

This invention will be better understood and other objects and advantages thereof will be more apparent from the following detailed description of preferred embodiments with reference to the accompanying drawings.

BRIEF EXPLANATION OF THE DRAWINGS

FIG. 8 is a flow chart showing a first program executed in the processing unit of the system of FIG. 7.

FIG. 9 is a flow chart showing a second program executed in the processing unit of the system of FIG. 7.

FIG. 10 is a flow chart showing a third program executed in the processing unit of the system of FIG. 7 for calculating vehicle speed from data obtained from the first and second programs.

DESCRIPTION OF THE PREFERRED EMBODIMENTS

Figure 1:
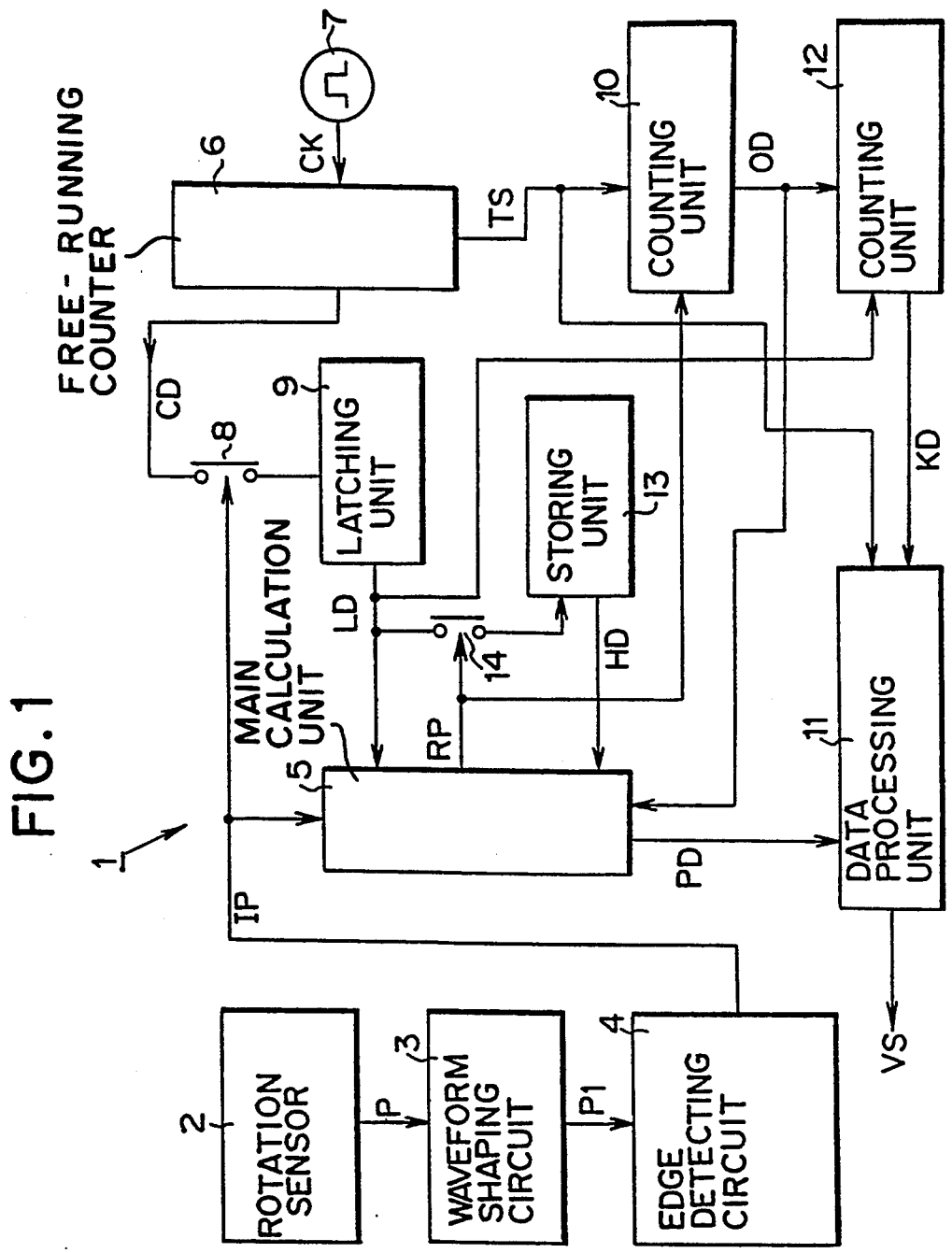
FIG. 1 is a block diagram showing a first embodiment of a vehicle speed measuring system according to the invention.

FIG. 1 shows a vehicle speed measuring system 1 constituted to use the method of the present invention for obtaining vehicle speed data indicating the traveling speed of a vehicle. The vehicle speed measuring system 1 has a rotation sensor 2 of well known type for outputting a pulse P each time a propeller shaft (not shown) of the vehicle rotates by a prescribed angle. The pulses P are sent to and shaped by a waveform shaping circuit 3. The shaped pulses P1 output by the waveform shaping circuit 3 are forwarded to an edge detecting circuit 4 which detects the time of the significant (rising) edge of the shaped pulses P1 and outputs pulses indicating this time. The pulses output by the edge detecting circuit 4 are input as input pulses IP (see FIG. 6) to a main calculation unit 5 for calculating the period of the pulses P.

A free running counter 6 counts periodic clock pulses CK output by a clock pulse generator 7 and outputs data CD indicating the result of its count to a latching unit 9 through a normally open switch 8 that closes in response to the occurrence of the input pulse IP. Each time the free running counter 6 experiences a count overflow, it outputs a time signal TS indicating this fact to a counter 10 for counting the number of time signals TS that occur and to a data processing unit 11.

Recurrence data OD indicating the number of overflows counted by the counter 10 and latch data LD indicating the count value latched by the latching unit 9 are forwarded to a counting unit 12 where the lapsed time is calculated in a manner to be explained later. Lapsed time data KD indicating the calculated lapsed time is sent to the data processing unit 11.

The latch data LD is also sent to a hold unit 13 through a normally open switch 14 that closes in response to a reset pulse RP output by the main calculation unit 5. The hold unit 13 holds the content of the latch data LD at the time the switch 14 closes. The hold data HD held by the hold unit 13 is forwarded to the main calculation unit 5. The reset pulse RP is also input to the counter 10 for resetting the same.

Based on the input pulse IP, the latch data LD, the hold data HD and the recurrence data OD, the main calculation unit 5 calculates the time between the occurrence of consecutive pulses IP and outputs the result as period data PD.

Figure 2:
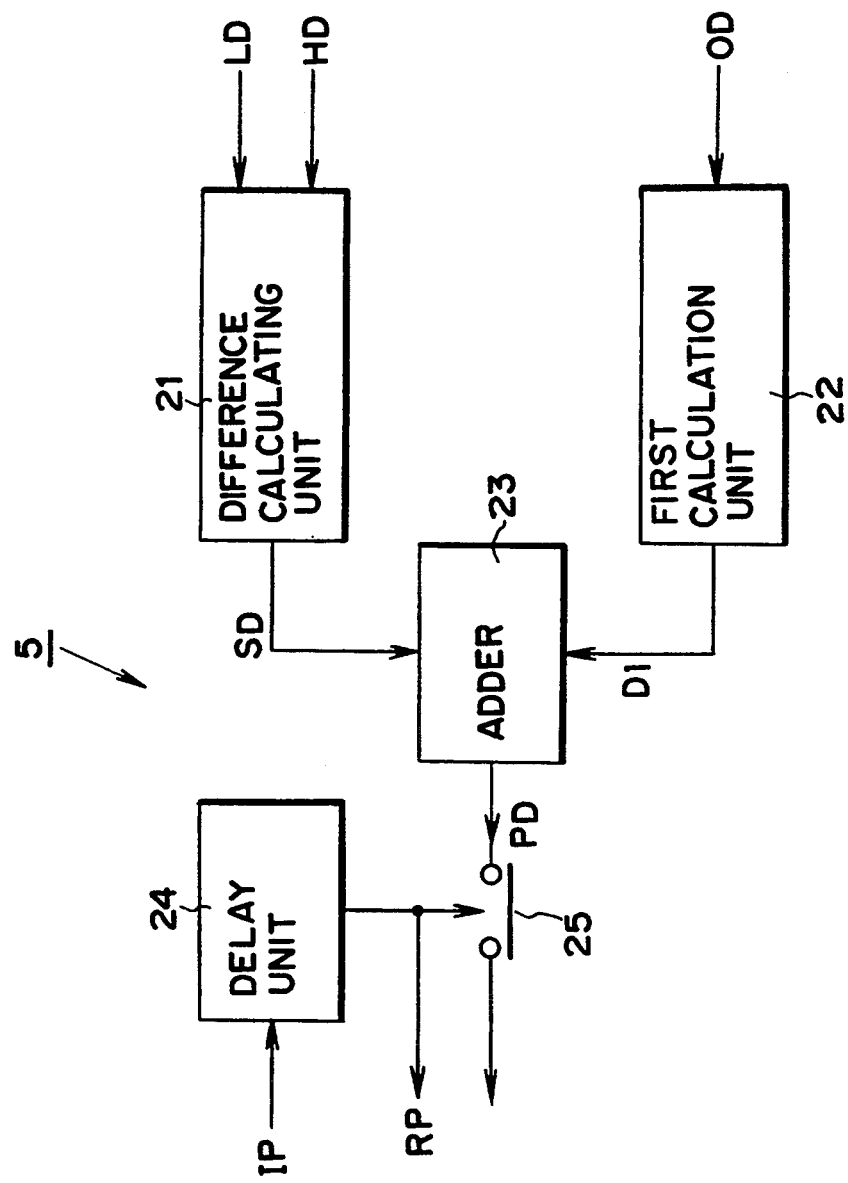
FIG. 2 is a detailed block diagram of the main calculation unit of the system of FIG. 1.

The main calculation unit 5, which is shown in detail in the block diagram of FIG. 2, has a difference calculating unit 21 which calculates the difference between the latch data LD and the hold data HD and outputs the result as difference data SD and also has a first calculation unit 22 which multiplies the recurrence data OD by data MAX indicating the maximum count capacity of the free running counter 6 and outputs the result as first timer data D1. The data MAX indicating the maximum count capacity is stored in the first calculation unit 22 in advance for use in prescribed calculations.

The difference data SD and the first timer data D1 are added in an adder 23 and the sum data indicating the result is output by the adder 23 as the period data PD. The period data PD is read out at prescribed times through a switch 25 that is open/closed controlled by the output of a delay circuit 24. More specifically, the input pulse IP is applied to the delay circuit 24 and after the lapse of a prescribed delay time following its application, the delay circuit 24 closes the switch 25, whereby the period data PD is sent to the data processing unit 11. The delay time is set to be a little longer than the time required for the period data PD to be generated by the adder 23 after input of the input pulse IP. The output of the delay circuit 24 is also used as the reset pulse RP.

In the foregoing arrangement, the switch 8 closes at the time the input pulse IP occurs and the count data CD at that time is latched by the latching unit 9. The latch data LD latched by this latching operation is sent to and held by the hold unit 13 when the switch 14 closes in response to the reset pulse RP. Then when the switch 8 is closed by the occurrence of the next input pulse IP, the latching unit 9 latches the count data CD at that time.

In other words, the latching unit 9 latches data indicating the time of occurrence of the most recent input pulse IP and the hold unit 13 holds data indicating the time of occurrence of the next earlier input pulse IP. The difference data SD output by the difference calculating unit 21 is therefore related to the time between the occurrence of the next earlier input pulse IP and the occurrence of the most recent input pulse IP.

On the other hand, in the case where the free running counter 6 overflows during the period between the occurrence of the next earlier input pulse IP and the occurrence of the most recent input pulse IP, the first calculation unit 22 calculates the first timer data D1 based on the number of overflow occurrences, whereafter the result is added to the difference data SD in the adder 23 to obtain the period data PD, which indicates the time between the occurrence of the next earlier input pulse IP and the occurrence of the most recent input pulse IP taking the number of overflows into account.

Figure 3:
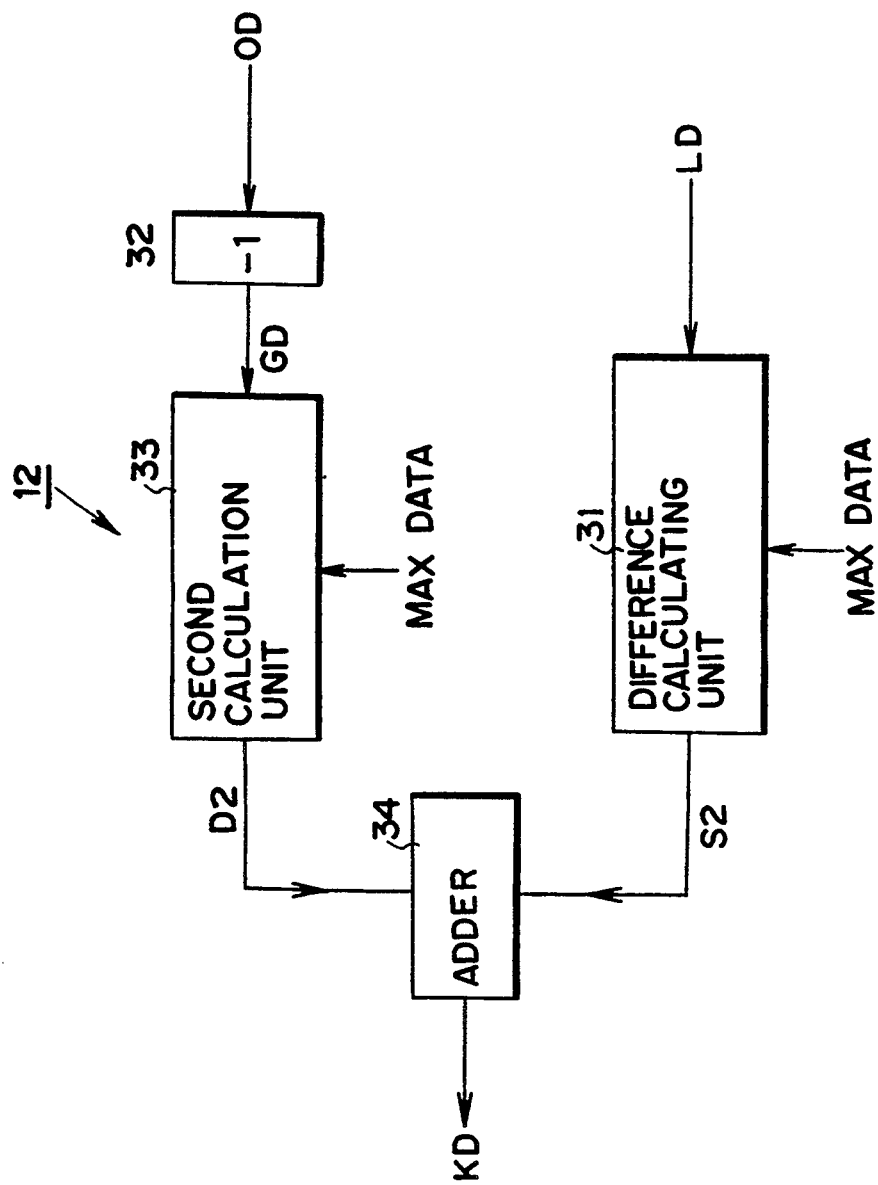
FIG. 3 is a detailed block diagram of the counting unit of the system of FIG. 1.

The counting unit 12 will now be explained with reference to FIG. 3. The counting unit 12 is provided for calculating the time that lapses between the occurrence of the most recent input pulse IP and the occurrence of the most recent time signal TS. A difference calculating unit 31 subtracts the value indicated by the latch data LD from the data MAX indicating the maximum count capacity of the free running counter 6 and outputs the result as difference data S2. On the other hand, the value of recurrence data OD indicating the number of overflow occurrences is reduced by 1 in a subtracter 32 and the result, output as subtracted data GD, is multiplied by the data MAX in a second calculation unit 33. The product of the multiplication in the second calculation unit 33 is forwarded as second timer data D2 to an adder 34 which adds it to the difference data S2 received from the difference calculating unit 31.

This sum obtained in the adder 34 indicates the time that lapsed between the occurrence of the most recent input pulse IP and the occurrence of the most recent time signal TS and is output as the lapsed time data KD.

Figure 4:
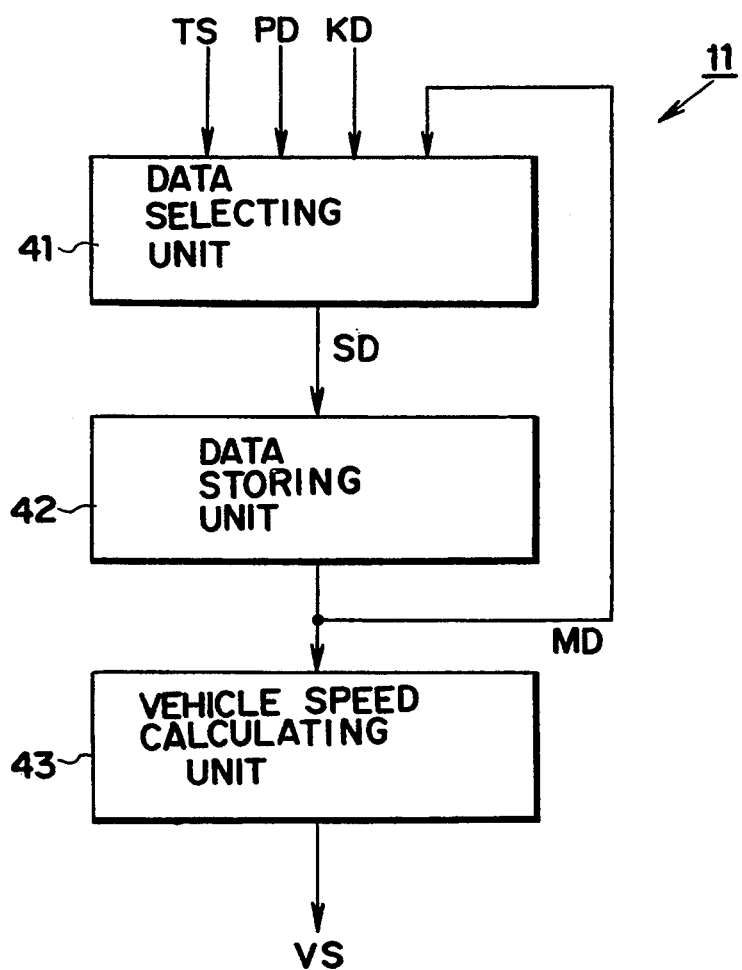
FIG. 4 is a detailed block diagram of the data processing system of the system of FIG. 1.

The data processing unit 11 shown in FIG. 1 is for calculating vehicle speed data VS from the period data PD, the lapsed time data KD and the time signal TS. It is shown in detail in the block diagram of FIG. 4.

The data processing unit 11 consists of a data selecting unit 41 for selecting one or the other of the period data PD and the lapsed time data KD, a data storing unit 42 for storing as MD the data SD selected by the data selecting unit 41, and a vehicle speed calculating unit 43 for calculating the vehicle speed from the time data stored in the data storing unit 42 and outputting the result as the vehicle speed data VS.

Figure 5:
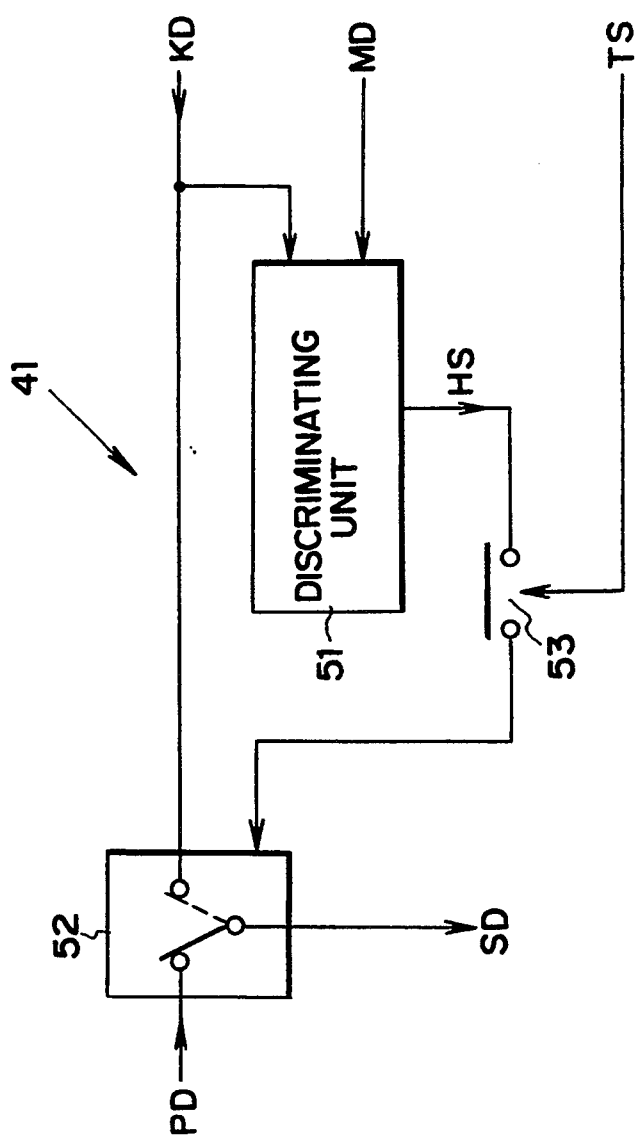
FIG. 5 is a block diagram of the data selecting unit of the data processing system of FIG. 4.

As shown in FIG. 5, the data selecting unit 41 has a discriminating unit 51 for comparing the length of the time periods indicated by the lapsed time data and the time data MD and used for calculating the vehicle speed in the preceding cycle and stored in the data storing unit 42, and a selector switch 52 for selecting one or the other of the lapsed time data KD and the period data PD as the selected data SD. The main calculation unit 5 outputs a discrimination signal HS whose level is either H or L depending on the result of the discrimination. The discrimination signal HS is forwarded to the selector switch 52 through a switch 53 which closes in response to the application of the time signal TS.

In the illustrated embodiment, the discrimination signal HS becomes L level when KD is smaller MD, in which case the selector switch 52 assumes the selection state shown by a solid line, and becomes H level when KD is equal to or greater than MD, in which case the selector switch 52 assumes the selection state shown by the broken line. Therefore, when the time signal TS is not being output, the selector switch 52 selects the period data PD as the selected data SD, but when the switch 53 is closed in response to the output of the time signal TS, it selects either the data PD or the data KD in accordance with the discrimination of the discriminating unit 51.

The operation of the vehicle speed measuring system 1 explained in the foregoing with reference to FIGS. 1-5 will now be explained with reference to FIG. 6.

For the purpose of this explanation assume that while the edge detecting circuit 4 is outputting the input pulses IP as a train of approximately evenly spaced pulses IP1, IP2, IP3 . . . a noise pulse NP occurs and is superposed on the train of pulses immediately after pulse IP2.

As was explained earlier, the main calculation unit 5 calculates the period data PD as, for example TM1, TM2, TM3 . . . , at the time each successive input pulse IP is output. Therefore, when the noise pulse NP is output shortly after the occurrence of input pulse IP2, the period data PD calculated on the basis of time t4 between the occurrence of these two pulses becomes a value TM4 representing a vehicle speed that is much faster than the actual speed.

Figure 6:
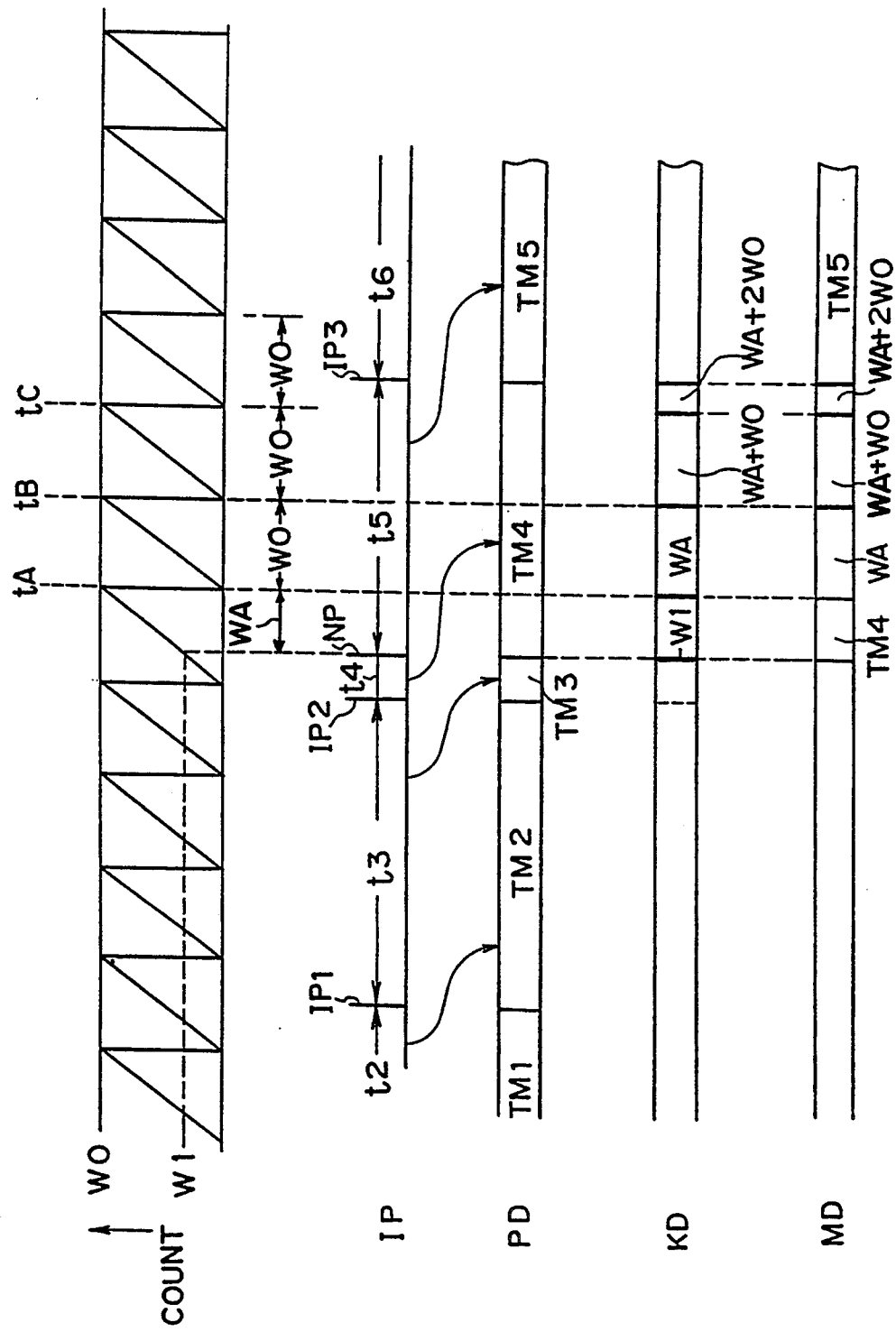
FIG. 6 is a chart for explaining the operation of the system of FIG. 1, showing how various data are modified in response to input pulses.

As shown in FIG. 6, at the counting unit 12 the count value W1 of the free running counter 6 at the time of the occurrence of the noise pulse NP is input as the latch data LD. As a result, the counting unit 12 outputs the difference WA between the count value W1 and the maximum count capacity W0 of the free running counter 6 as the difference data S2 and, at the same time, the value of the second timer data D2 becomes −W0. The value of the lapsed time data KD indicating the time lapse following the occurrence of the noise pulse NP thus becomes −W1.

Since the lapsed time data KD increases by W0 with each overflow of the free running counter 6, its value becomes WA, WA+W0, WA+2W0 with successive overflows of the free running counter 6 (see FIG. 6).

In the data selecting unit 41, therefore, when the free running counter 6 overflows at time tA, KD becomes larger than MD so that the level of the discrimination signal HS becomes H. This discrimination signal HS is applied to the selector switch 52 when the switch 53 is closed (tA), whereby lapsed time data KD is output as the selected data SD. As a result, the content of the data storing unit 42 becomes WA after time tA.

In a similar manner, the content of the selected data SD progressively becomes WA+W0, WA+2W0 when the free running counter 6 overflows at times tB, tC.

Then when the input pulse IP3 is output, since the value of the period data PD becomes TM5 and the content of the hold data TM becomes TM5, the level of the discrimination signal HS becomes L so that the selector switch 52 selects the period data PD as the selected data SD. As a result, the occurrence of the input pulse IP3 causes the content of the hold data MD to be changed from W1+2W0 to TM5.

As will be understood from the foregoing explanation, even though data indicating a short period (data TM4) is erroneously produced owing to the occurrence of the noise pulse NP, since the hold data used for calculating the vehicle speed is corrected by being replaced with the lapsed time data KD which increases by W0 with each succeeding overflow of the free running counter 6, the incorrect data value TM4 is not retained up to the time of the input of the next input pulse IP3 but is replaced by data that grows larger with each succeeding overflow of the free running counter 6. The various vehicle control operations that use the vehicle speed data VS as a parameter can therefore be conducted stably with minimum disturbance from the occurrence of noise pulses and the like.

Figure 7:
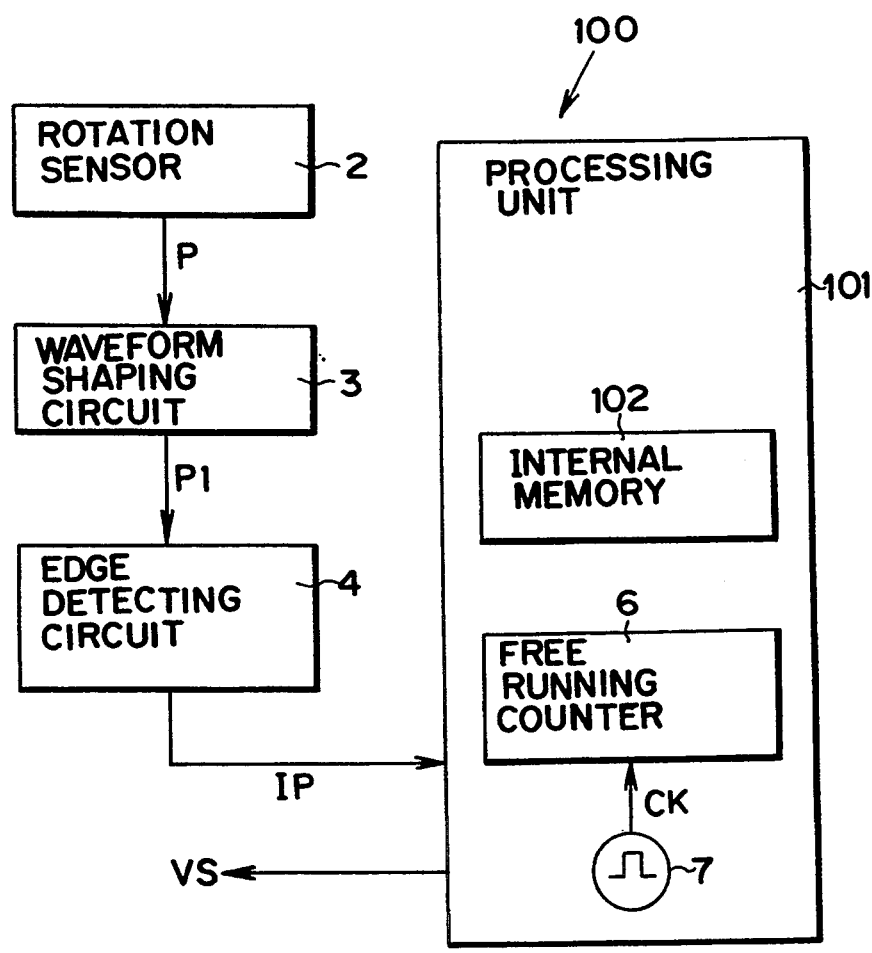
FIG. 7 is a block diagram showing another embodiment of a vehicle speed measuring system according to the invention.

A vehicle speed measuring system with the same capabilities as the vehicle speed measuring system 1 shown in FIG. 1 can also be realized using a microcomputer for processing the input pulses IP in accordance with a program. A vehicle speed measuring system 100 constituted in this manner for measuring vehicle speed in accordance with this invention is illustrated in FIG. 7. The system 100 has a processing unit 101 which processes the input pulses IP in the same manner as the system shown in FIG. 1. Constituent elements shown in FIG. 7 which are the same as those in FIG. 1 are assigned the same reference symbols as those in FIG. 1 and will not be explained further.

The processing unit 101 is constituted as a microcomputer system of known design and has an internal memory 102 which stores processing programs for obtaining the vehicle speed data VS in response to the input pulses IP. These programs consist of a first program 110 indicated by the flow chart of FIG. 8 that is executed on an interrupt basis in response to the input of an input pulse IP, a second program 120 indicated by the flow chart of FIG. 9 that is executed on an interrupt basis in response to overflow of the free running counter 6 which counts the clock pulses CK produced by a clock pulse generator 7 provided in the processing unit 101, and a third program 130 indicated by the flow chart of FIG. 10 that is executed at periodic intervals for calculating the vehicle speed from data generated by the first and second programs. These programs shown in FIGS. 8 to 10 will now be explained.

The first program 110 is executed on an interrupt basis in response to input of an input pulse IP. In step S111 thereof the content of a variable X is set to the result obtained by subtracting from data D(N) indicating the count value of the free running counter 6 at the time of the occurrence of the input pulse IP in the current cycle the data D(N-1) indicating the count value of the free running counter 6 at the time of the occurrence of the input pulse IP in the preceding cycle. Control then passes to step S112 in which the content of a variable Y is set to the product obtained by multiplying the overflow recurrence number NB of the free running counter 6 following input of the input pulse IP by the maximum count capacity W0 of the same free running counter 6, whereafter control passes to step S113. In step S113, the sum X+Y is set as the value of the period data PD, and in the next step S114, the data D(N-1) for the preceding cycle is replaced by data D(N) of the current cycle. Then in step S115 the overflow recurrence number is set to zero and the program is terminated.

The second program 120 is executed on an interrupt basis in response to overflow of the free running counter 6. The procedure starts with step S121 in which 1 is added to the overflow recurrence number NB. Control then passes to step S122 in which a variable Z is set to the value obtained by calculating W0−D(N-1), and then to step S123 in which a variable Q is set to the value obtained by calculating (NB−1)×(N−1). Control then passes to step S124 where the value Z+Q is set as R. In the following step S125, discrimination is made as to whether or not the value of R - PD is positive, and if it is, control passes to step S126 in which the value of R is set as the period data PD and the second program 120 is terminated. If the result of the discrimination in step S125 is NO, the second program 120 is terminated without executing step S126.

The third program 130 is executed at periodic intervals of, say, 50 msec. The procedure starts with step S131 in which the vehicle speed data VS is calculated from the period data PD and then control passes to step S132 in which other required processing is conducted, whereafter the third program 130 is terminated.

The first program calculates the period of the input pulses IP and produces the period data PD. The second program calculates the time that lapses between the occurrence of the most recent input pulse IP and each overflow of the free running counter 6 as R and replaces the period data PD with the value of R when R - PD is positive. The third program periodically calculates the vehicle speed data VS from the period data PD determined in this manner.

While in the foregoing embodiments the invention was explained as used for data processing for measurement of vehicle speed, the method of this invention is not limited to application in data processing for obtaining data indicating the period of pulses output once per prescribed angle of rotation of a rotating body but can be widely applied with similar effect for obtaining data indicating the period of various other kinds of pulses.

In accordance with the invention, when in the course of measuring the periods between consecutive pulses of a train of pulses each time a pulse occurs a noise pulse superposed on the train of pulses causes the measured period to become shorter than the actual period, the erroneous measured period is corrected by separately produced time signals so as to progressively approach the actual value. This is particularly advantageous in the case of pulses having a long period since it effectively prevents the erroneous measured period from being held for a long time. As a result, the noise resistance of the system to which the method of the invention is applied is markedly increased.

What is claimed is:

1. A data processing method for obtaining data indicating periods between measured pulses occurring at intervals which discriminates against noise pulses comprising:

a first measurement step for obtaining measured period data by measuring time intervals between occurrences of the measured pulses, a step for outputting individual time pulses of a prescribed fixed period, a second measurement step responsive to the individual time pulses for obtaining lapsed time data indicating a time lapse between the occurrence of the most recent measured pulse and the occurrence of the most recent time pulse, and a processing step for discriminating against noise pulses included in said measured pulses, responsive to the most recent lapsed time data and the most recent measured period data for outputting the most recent measured period data as the pulse period data at that time if the time period indicated by the most recent lapsed time data is shorter than the time period indicated by the most recent measured period data wherein no noise pulses are determined to be in said measured pulse period, and, up to the occurrence of the next measured pulse, outputting the most recent lapsed time data instead of the most recent measured period data as the pulse period data at that time if the time period indicated by the most recent lapsed time data is longer than the time period indicated by the most recent measured period data, which indicates that said measured pulse period includes a noise pulse.

2. A method as claimed in claim 1, wherein said second measurement step comprises a step responsive to the measured pulses for latching a count output by a counter means which receives clock pulses of a prescribed period as count pulses, a step for counting a number of overflows of the counter means, and a step for calculating the lapsed time from the data latched in the latching step and the number of overflows counted in the counting step.

3. A method as claimed in claim 2, wherein the calculating step comprises a first step for subtracting the data latched in the latching step from an upper count value of the counter means, a second step for subtracting 1 from the number of overflows, a third step for multiplying the result of the second step by the upper count value, and a fourth step for adding the results of the first step and the third step to obtain the lapsed time.

4. A method as claimed in claim 1, wherein the period of the time pulses is not longer than the period of the measured pulses.

5. A method as claimed in claim 2, wherein the time pulses are overflow signals output at each overflow of the counter means.

6. A method of calculating vehicle speed from periods between measured pulses output by a vehicle speed sensor at periods proportional to the vehicle speed comprising:

a first measurement step for obtaining measured period data by measuring time intervals between occurrences of the measured pulses, a second measurement step, responsive to individual time pulses output at a prescribed fixed period, for obtaining lapsed time data indicating a time lapse between the occurrence of the most recent measured pulse and the occurrence of the most recent time pulse, and a processing step for discriminating against noise pulses contained in said measured period, responsive to the most recent lapsed time data and the most recent measured period data for outputting the most recent measured period data as the pulse period data indicating the period of the measured pulses at that time if the time period indicated by the most recent lapsed time data is shorter than the time period indicated by the most recent measured period data wherein no noise pulses are determined to be in said measured period, and, up to the occurrence of the next measured pulse, outputting the most recent lapsed time data, each time the lapsed time data is obtained, instead of the most recent measured period data as the pulse period data at that time if the time period indicated by the most recent lapsed time data is longer than the time period indicated by the most recent measured period data, which indicates that said measured period includes a noise pulse.

7. A method as claimed in claim 6, wherein said second measurement step comprises a step responsive to the measured pulses for latching a count output by a counter means which receives clock pulse of a prescribed period as count pulses, a step for counting a number of overflows of the counter means, and a step for calculating the lapsed time from the data latched in the latching step and the number of overflows counted in the counting step.

8. A method as claimed in claim 7, wherein the calculating step comprises a first step for subtracting the data latched in the latching step from an upper count value of the counter means, a second step for subtracting 1 from the number of overflows, a third step for multiplying the result of the second step by the upper count value, and a fourth step for adding the results of the first step and the second step to obtain the lapsed time.

9. A method as claimed in claim 6, wherein the period of the time pulses is not longer than the period of the measured pulses.

10. A method as claimed in claim 7, wherein the time pulses are overflow signals output at each overflow of the counter means.

* * * * *